United States Patent [19]

Spies et al.

[11] Patent Number: 5,086,342
[45] Date of Patent: Feb. 4, 1992

[54] IMAGE SENSOR WITH AN AVALANCHE DIODE FORMING AN OPTICAL SHUTTER

[75] Inventors: Hans Spies, Pfaffenhofen; Alfons Woehrl, Schrobenhausen; Martin Spies, Pfaffenhofen, all of Fed. Rep. of Germany

[73] Assignee: Messerschmitt-Boelkow-Blohm GmbH, Munich, Fed. Rep. of Germany

[21] Appl. No.: 440,603

[22] Filed: Nov. 22, 1989

[30] Foreign Application Priority Data

Nov. 23, 1988 [DE] Fed. Rep. of Germany ....... 3829513

[51] Int. Cl.$^5$ .......................... H04N 3/14; H04N 5/335
[52] U.S. Cl. ............................ 358/213.13; 358/213.26; 357/13
[58] Field of Search ................ 358/213.12, 213.11, 358/213.13, 213.19, 213.23, 212; 357/30 A, 30 H, 24 LR, 13; 340/425.5, 435, 436, 901, 902, 903

[56] References Cited

U.S. PATENT DOCUMENTS

| | | | |
|---|---|---|---|
| 3,533,061 | 10/1970 | Treiterer | 340/435 |
| 3,737,851 | 6/1973 | Marshall et al. | 340/31 R |
| 3,745,424 | 7/1973 | Ohuchi et al. | 357/13 |
| 3,889,284 | 6/1975 | Schiel | 357/13 |
| 4,083,062 | 4/1978 | Ohuchi et al. | 357/13 |
| 4,212,019 | 7/1980 | Watase et al. | 357/30 |
| 4,382,187 | 5/1983 | Fraleux et al. | 358/213.11 |
| 4,447,800 | 5/1984 | Kasuya et al. | 340/901 |
| 4,489,350 | 12/1984 | Kimura | 358/213.13 |
| 4,556,912 | 12/1985 | Yamanaka et al. | 358/213.13 |
| 4,665,325 | 5/1987 | Yamada et al. | 357/24 LR |
| 4,731,641 | 3/1988 | Matsushima et al. | 357/30 A |
| 4,875,100 | 10/1989 | Yonemoto et al. | 358/213.13 |
| 4,901,154 | 2/1990 | Suga et al. | 358/213.13 |
| 4,902,886 | 2/1990 | Smisko | 358/213.15 |
| 4,939,579 | 7/1990 | Nakamura | 358/213.12 |
| 4,951,147 | 8/1990 | Aknar et al. | 358/209 |
| 4,982,255 | 1/1991 | Tomita | 357/13 |

FOREIGN PATENT DOCUMENTS

3640449 6/1988 Fed. Rep. of Germany.
3817153 11/1989 Fed. Rep. of Germany.

OTHER PUBLICATIONS

Elektronikpraxis (Nr. 9) Sep. 1978, pp. 12-14, "Zeilen-und flaechenhafte Halbleiter-Bildsensoren", H. Herbst.
The Radio and Electronic Engineer, vol. 50, No. 5, May 1980, "Development of c.c.d. area image sensors for 625-line television applications", by D. J. Burt, pp. 205-212.
Bild der Wissenschaft, pp. 134-135, Nr. 10, 1988, "Prometheus-Steuermann durch den Verkehr von morgen".
"Integrated Optics: Theory and Technology", 2 cover sheets and pp. 246-254, Published by Springer-Verlag, Berlin, Heidelberg, New York, 1982.
"Multi-Element Reachthrough Avalanche Photodiodes", by Paul P. Webb, et al., IEEE Transactions on Electron Devices, vol. ED-31, No. 9, Sep., 1984, pp. 1206 to 1212.
"Neue Entwicklungen bei Halbleiter-Bildsensoren", F. & KT CCD-Kamera, by Siegfried Koenig, (Fernseh-Und Kino-Technik, 39. Jarhgang.Nr.1/1985.
"Silicide camera mid-wave infrared imagery", by Benjamin R. Capone et al., 186/SPIE vol. 570, Solid State Imaging Arrays (1985), pp. 186-190.
"Autos am laufenden Band", Verkehrstechnik, Funkschau 14/1988, pp. 42-44.

Primary Examiner—James J. Groody
Assistant Examiner—Jeffrey S. Murrell
Attorney, Agent, or Firm—W. G. Fasse; D. H. Kane, Jr.

[57] ABSTRACT

A semiconductor image sensor having a CCD-structure, includes sensor elements arranged in a linear or in a two-dimensional array suitable for a parallel or serial read-out of information. An avalanche diode is arranged between a p-layer and a high resistance n-layer on a light inlet side of the semiconductor device. The charge carriers coming from the avalanche diode are transferred to a CCD-structure in response to an electrical control signal applied to the p-layer and the n-layer of the image sensor. This construction forms an optical shutter that is controllable by pulses of short duration within the range of about 1 to 10 ns.

3 Claims, 3 Drawing Sheets

IMAGE SENSOR WITH AN AVALANCHE DIODE FORMING AN OPTICAL SHUTTER

CROSS REFERENCE TO RELATED APPLICATION

The present application relates to U.S. Pat. No. 5,005,085, which issued on Apr. 2, 1991, entitled: CONTROLLABLE SEMICONDUCTOR IMAGE SENSOR AND ARRANGEMENT WITH SUCH A SENSOR.

FIELD OF THE INVENTION

The invention relates to a semiconductor image sensor especially a CCD-structure with a linear or two-dimensional array and a parallel or serial information read-out. The image sensor is combined with an avalanche diode to form an optical shutter.

BACKGROUND INFORMATION

Semiconductor image sensors are known. The use of such sensors is, for example, described in an over-view article in the publication "Elektronik-Praxis", No. 9, September 1978, page 12 and following pages.

The difficulties reside in the high degree of integration required and in the available technology that can be applied for integration.

OBJECT OF THE INVENTION

It is an object of the present invention to provide an image sensor which, by using known semiconductor components and technologies, is a controllable sensor capable of providing a substantial useful output signal, thereby opening new possibilities of using such a sensor as an optical shutter.

SUMMARY OF THE INVENTION

According to the invention there is provided a semiconductor image sensor especially a CCD-structure with a linear or two-dimensional array and a parallel or serial information read-out, wherein an avalanche diode is arranged on one side of the semi-conductor. The charge coupled device produces a photon current in response to incident light from the outside. A space charge is produced in the neighboring or adjacent semiconductor zone and a charge carrier transport to the CCD-structures takes place through a controllable electrode, in which on the other side of the semiconductor a CCD-read-out structure is arranged, including read-out electrodes to output a contrast or distance image; and wherein the sensor is electrically controllable by applying a voltage between a p-doped layer on the side for the incident light and a neighboring highly resistant n-doped layer.

Thus, an electrical shutter for a photo element is provided, having a useful output signal that is about 100 times larger than the respective output signal in known CCD-arrangements. The amplification effect in the present sensor is controllable by means of an avalanche voltage.

A special advantage of the invention is seen in the fact that a CCD-sensor has been provided which can be switched on and off in a time frame of about 10 ns and less, namely between 1 and 10 ns.

BRIEF DESCRIPTION OF THE DRAWINGS

In order that the invention may be clearly understood, it will now be described, by way of example, with reference to the accompanying drawings, wherein.

DETAILED DESCRIPTION OF A PREFERRED EXAMPLE EMBODIMENT

Figure 1:
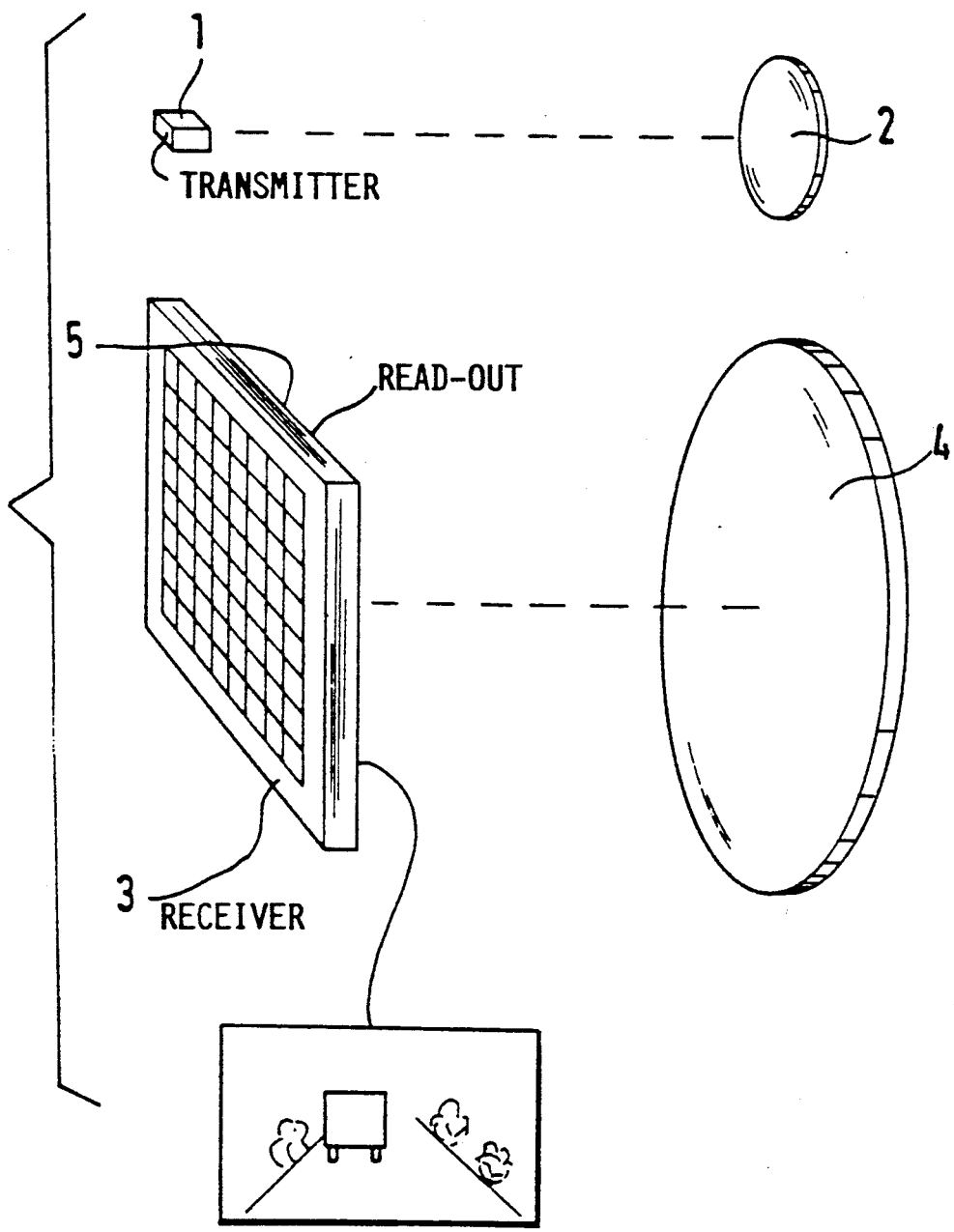
FIG. 1 shows the present sensor in a system for an automatic vehicle control along a highway.

FIG. 1 shows the overall arrangement or construction of the system with a transmitter 1 and receiver 3. The invention makes possible the use of the present image sensor in a guidance system for the automatic vehicle guiding, steering and controlling of motor vehicles on a highway. The present sensor may be applied with special advantage in a laser guidance system for maintaining spacings between motor vehicles. In such a laser guidance system a distance measurement is made to an obstacle by means of a laser device which measures a distance to a stationary or moving obstacle such as a vehicle. An image as obtained by the new image sensor, is shown on a reduced scale below the CCD-array in FIG. 1. The transmitter 1 of the system includes a transmitter lens 2 and the receiver includes a receiver lens 4 and a read-out for displaying information.

Figure 2:
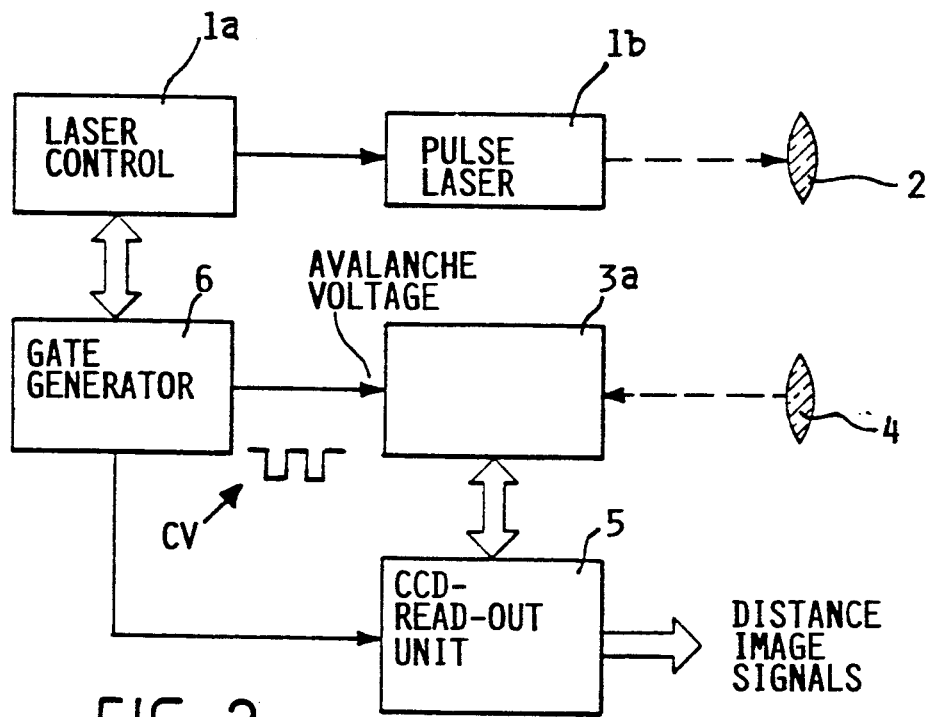
FIG. 2 shows a block circuit diagram of the system of FIG. 1.

In FIG. 2 the block circuit diagram of the function blocks is self-explanatory. The transmitter 1 includes a laser control 1a for controlling a pulse laser 1b which transmits its beam through the lens 2. The laser control 1a is connected with a gate generator which supplies an avalanche voltage to a controllable image sensor 3a forming part of the receiver 3 and receiving light through the lens 4. The transmitter 1 illuminates a scene to be sensed through the transmitter lens 2. The image sensor 3a and the gate generator 6 are connected to the read-out 5 which is a CCD-read-out that generates a distance image signal.

Figure 3:
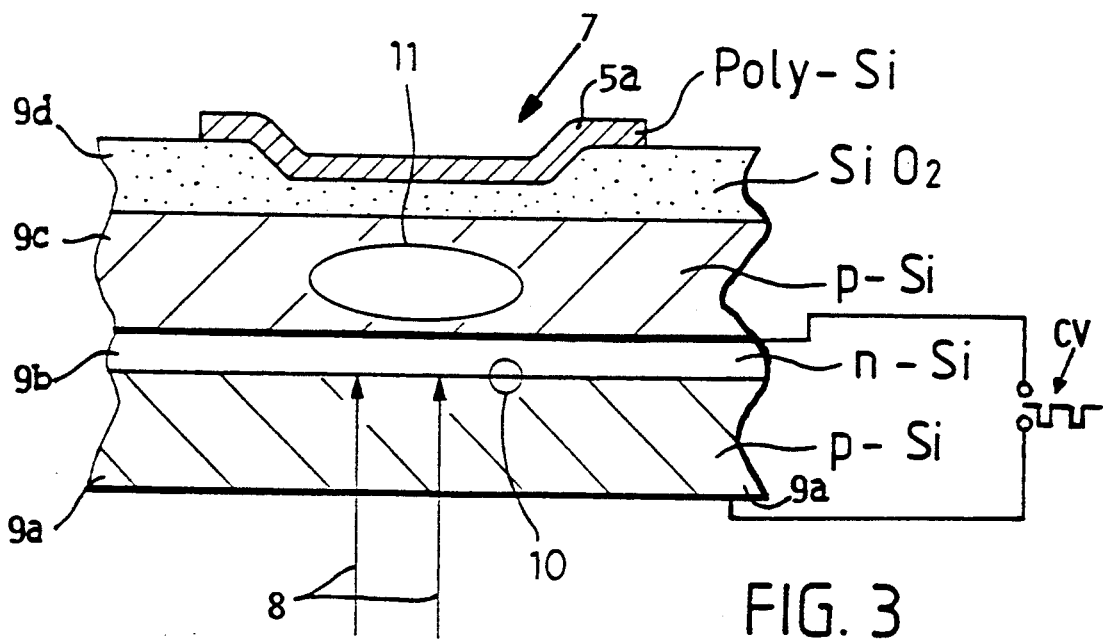
FIG. 3 illustrates a cross-section through a single photosensitive cell used in the present sensor.

In FIG. 3 the construction of an individual photosensitive image sensor element 7 is shown in section, whereby the incident radiation, for example light, comes into the sensor element 7 from below as shown by the arrows 8. The sensor element 7 is a semiconductor device comprises a p-n-p-structure. An avalanche diode 10 forms an amplifier in a zone in the boundary area between a first p-silicon layer 9a and an n-silicon layer 9b. A second p-silicon layer 9c is arranged above the n-silicon layer 9b. The electrical control of the image sensor is accomplished by producing a space charge in ar area 11 for the CCD-transport. As shown in FIG. 3, the area 11 is advantageously located approximately in the central zone of second layer p-silicon layer 9c above the highly resistant n-silicon layer 9b. The n-silicon layer 9b has a high ohmic resistance. A transparent layer 9d, for example, silicon dioxide is arranged above the second p-silicon layer 9c. The CCD-read-out gate electrode 5a is arranged in a small depression in the transparent layer 9d above space charge area 11. The CCD-read-out B11 structure including, for example, zones of poly silicon or similar suitable material, which has been applied by a known partial coating technique for forming the read-out structure. The read-out and evaluation is known as such and therefore not described in more detail nor illustrated in more detail, see German Patent Publication 3,817,153 A1, corresponding to U.S. Ser. No. 07/354,469, filed May 19, 1989, or see "The Radio and Electronic Engineer", Vol. 50, No. 5, pages 205 and 206. However, the control voltage CV for the charge carrier transport is applied, as mentioned above, between the p-layer 9a facing the incident light 8 and the n-layer 9b.

Figure 4:
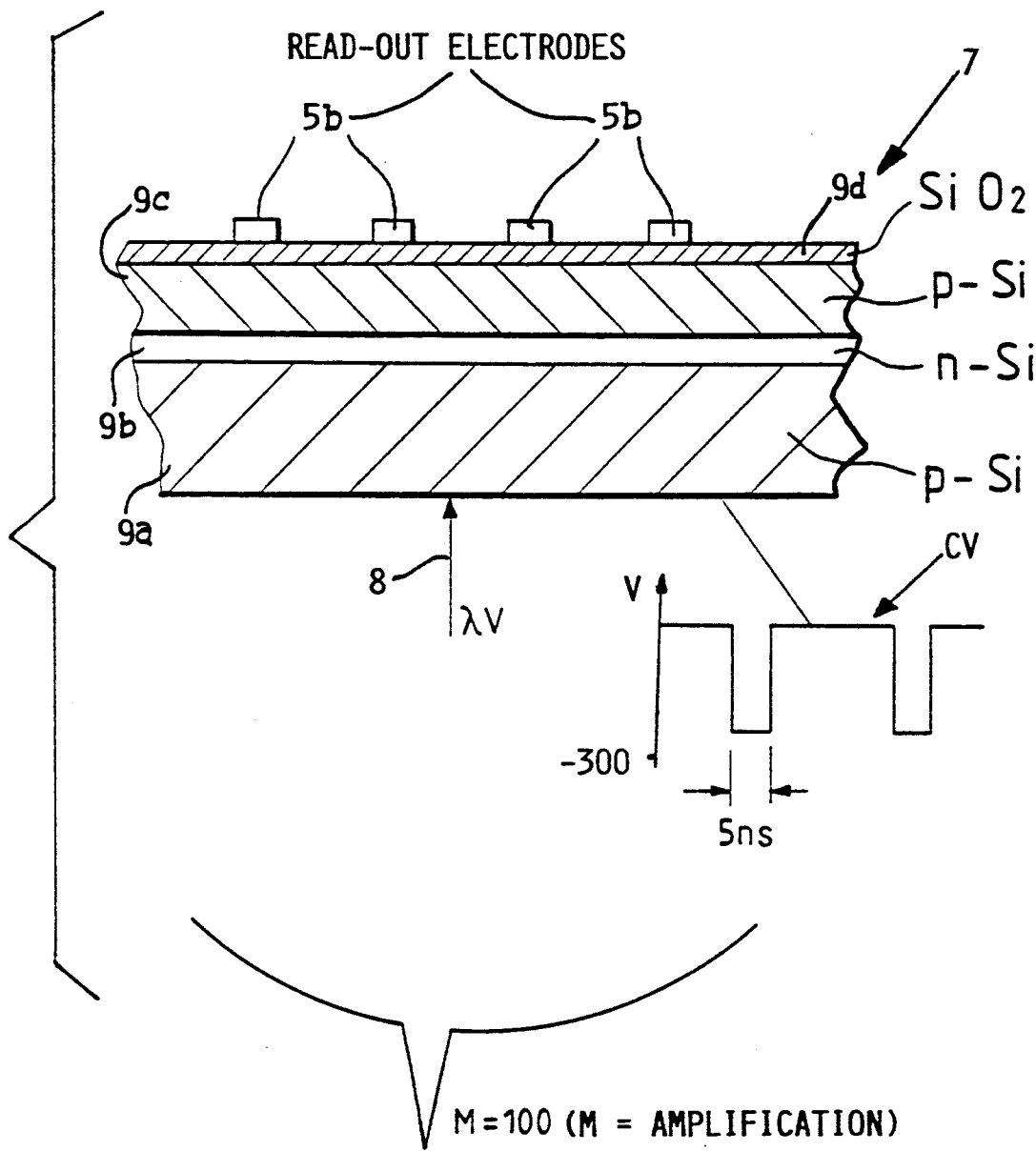
FIG. 4 illustrates a detail of the image sensor element.

FIG. 4 shows a detail of the image sensor element 7. The upper portion of FIG. 4 shows the essential layer structure with layers 9a, 9b, 9c forming a p-n-p-arrangement including the high ohmic resistant n layer 9b in the central zone of a sandwich type structure. On the upper side of FIG. 4 there is an $SiO_2$ layer 9d partially covered by aluminum electrodes 5b for the read-out of the sensor element 7. The light input or the incident light 8 of the radiation to be measured has a wave length λV and is directed from the bottom up in FIG. 4. The avalanche effect, especially the amplification effect for a 100 fold amplification, is illustrated symbolically below the sectional view in FIG. 4. The pulse diagram of FIG. 4 shows the application of a negative control voltage CV of 300 V to the first layer 9a for opening the sensor in a time frame of about 5 ns as shown in the right lower part in FIG. 4 of the cross-section next to the layer structure. The layer 9a is provided with a conventional electrode not shown.

The important construction of the present two dimensional image sensor is seen in that the areal CCD-structure is arranged on one side of the image sensor and the avalanche diode 10 is formed on the side backside of the The avalanche diode 10 is especially formed by implanting or doping with doping materials known for this purpose. If in the above described construction, a control voltage CV is applied between the high ohmic or resistant n-layer 9b and the light facing p-layer 9a, an avalanche effect is produced when simultaneously incident light enters into the image sensor at the respective location as indicated at 8. The avalanche effect causes a high field strength which on its part produces charge carriers in the area 11 of the p-layer 9c below the CCD-structure of the image sensor, please see FIG. 3: these charge carriers are read-out with the aid of a suitable electrode construction shown at 5a and 5b. Since the avalanche diode 10 is effective over the entire surface area, and since the charge transport takes place in the individual volumes of the semiconductor toward the CCD-structure of the sensor 7, a surface type constrast image is formed at the time the sensor is switched open, or at the time of an information read-out. Thus, by a suitable selection of the starting point for switching the sensor open by a suitable selection of the sensor opening duration in nanoseconds (ns) and by a correlation of the switching impulses with the transmitter impulses, a distance image is depicted.

The invention provides, among other things, an electronic, optical shutter in a photosensitive image sensor element especially for a CCD-camera. The shutter has, in addition to the large amplification or sensitivity increase by the factor of about 100, very short operating or opening times in the time frame below 10 ns. Such qualities have heretofore not been available while also taking into account the effort and expense.

The application of the invention is advantageous in connection with spacing warning systems and distance monitoring system systems by means of lasers as disclosed in German Patent Publication (DE) 3,640,449 A1. In such systems, for example known as "integrated service data network" (ISDN), a determined spacing is maintained automatically between vehicles following a guide track.

The application in an automatic guide system known under the name "Prometheus" is especially advantageous. The automatic guide system is described in "Bild der Wissenschaft", No. 10/1988, page 134.

Although the invention has been described with reference to specific example embodiments, it will be appreciated that it is intended to cover all modifications and equivalents within the scope of the appended claims.

What we claim is:

1. An image sensor forming an optical shutter, comprising a first input light (8) facing semiconductor layer (9a) having a p-conductivity, a second semiconductor layer (9b) having an n conductivity on said first layer opposite a light facing surface of said first layer, an avalanche diode (10) between said first and second semiconductor layers for amplifying a photocurrent produced in response to a light input, a further semiconductor layer (9c) of p-conductivity on said second layer (9b), control means (6) including control electrode means for applying a control signal (CV) to said first and second layers for controlling a charge carrier transport, read-out means (5a, 5b) on said third layer, said read-out means and said further semiconductor layer forming a charge coupled device positioned for cooperating with said avalanche diode (10), wherein said control signal (CV) opens and closes said shutter electronically by permitting and interrupting a charge transport in said charge coupled device.

2. The image sensor of claim 1, wherein said control means produce control signal pulses having a duration within the range of 1 to 10 nanoseconds.

3. The image sensor of claim 1, wherein said second n-type semiconductor layer has a high ohmic resistance compared to said first p-type semiconductor layer.

* * * * *

UNITED STATES PATENT AND TRADEMARK OFFICE
CERTIFICATE OF CORRECTION

PATENT NO. : 5,086,342

DATED : February 4, 1992

INVENTOR(S) : Hans Spies et al.

It is certified that error appears in the above-identified patent and that said Letters Patent is hereby corrected as shown below:

On the title page:

[30] Foreign Application Priority Data

Nov. 23, 1988 [DE] Fed. Rep. of Germany   3839513

Claim 1, line 4, column 4, line 32, replace "an conductivity" by --an n-conductivity--.

Signed and Sealed this

Twenty-seventh Day of April, 1993

*Attest:*

MICHAEL K. KIRK

*Attesting Officer*   *Acting Commissioner of Patents and Trademarks*